United States Patent [19]
Holmberg

[11] Patent Number: 6,158,341
[45] Date of Patent: Dec. 12, 2000

[54] METHOD FOR TRANSFERRING A PICTURE TO A SURFACE

[75] Inventor: Per Holmberg, Dalby, Sweden

[73] Assignee: Telefonaktiebolaget L M Ericsson (publ), Stockholm, Sweden

[21] Appl. No.: 09/156,651

[22] Filed: Sep. 18, 1998

[30] Foreign Application Priority Data

Sep. 22, 1997 [SE] Sweden .................................. 9703410

[51] Int. Cl.⁷ .................................................. B41F 17/00
[52] U.S. Cl. ............................ 101/170; 101/35; 101/483
[58] Field of Search ................................ 101/35, 41, 42, 101/43, 44, 150, 163, 167, 169, 170, 483

[56] References Cited

U.S. PATENT DOCUMENTS

| | | | |
|---|---|---|---|
| 2,748,696 | 6/1956 | Murray | 101/41 |
| 4,557,195 | 12/1985 | Phlipp | 101/163 |
| 4,738,199 | 4/1988 | Chen | 101/163 |
| 5,270,493 | 12/1993 | Inoue et al. | 174/253 |
| 5,383,398 | 1/1995 | Binnen | 101/41 |
| 5,560,291 | 10/1996 | Shu | 101/41 |
| 5,593,602 | 1/1997 | Gelder et al. | 216/42 |

FOREIGN PATENT DOCUMENTS

| | | |
|---|---|---|
| 0 537 649 A1 | 4/1993 | European Pat. Off. . |
| 0 706 153 A2 | 4/1996 | European Pat. Off. . |
| 197 15 379 A1 | 10/1998 | Germany . |
| 57-70663 | 5/1982 | Japan .................. 101/163 |
| 59-52654 | 3/1984 | Japan .................... 101/44 |
| 7-214754 | 8/1995 | Japan . |
| WO 96/03466 | 2/1996 | WIPO . |
| WO 97/34459 | 9/1997 | WIPO . |

OTHER PUBLICATIONS

PCT International Search Report dated Feb. 14, 1999.

*Primary Examiner*—John S. Hilten
*Assistant Examiner*—Leslie J. Grohusky
*Attorney, Agent, or Firm*—Jenkens & Gilchrist, P.C.

[57] ABSTRACT

The present invention relates to a method and an arrangement for transferring a conductive picture (12) to an irregular surface of a mobile phone casing (4) for shielding the mobile phone casing from electromagnetic radiation. It also relates to the printing colour used for the conductive picture and tampon pads (5) used for the transferring of the conductive printing colour to the phone casing (4). Conductive partial pictures (7) are printed on the irregular surface of the casing (4) step by step by means of tampon pads until the complete conductive picture (12) is achieved. The tampon pad has a shape corresponding to the surface of the phone casing. The printing colour has a composition, which facilitates the adhering on the tampon pad. The invention also describes a method for printing an electrical circuit pattern on a phone casing (4) by using the above mentioned tampon pads and printing colour.

19 Claims, 9 Drawing Sheets

METHOD FOR TRANSFERRING A PICTURE TO A SURFACE

FIELD OF INVENTION

The present invention relates to a method for transferring a conductive picture to an arbitrary surface of a detail by means of a printing means, an arrangement for transferring the conductive picture to the detail, a printing colour used for the conductive picture and printing pads used for the transferring of the printing colour. It also relates to a method for printing an electrical circuit pattern on a detail, e.g. a PCB, by using a printing pad, and an apparatus having at least one electrical component to be shielded from electromagnetic radiation.

BACKGROUND OF THE INVENTION

It is previously known to transfer a predetermined picture to a surface by means of screen-printing or tampon printing. By means of these methods, it is also possible to print on slightly bulged surfaces. However, today's printing technique imposes strong restrictions when it comes to printing on somewhat more complicated surfaces. Such surfaces can e.g. be very bulged, arched with small radii, angled and provided with angled corners, located adjacent to recesses, bumps, projections, protrusions and holes. There can also be surfaces, which are combinations of the above variations.

If the skilled person wants to print e.g. a conductive layer using today's technique (spraying, vacuum metallization) on for example the inside of a mobile phone casing which has surfaces of the type described above, this will be very expensive, time consuming and still the result will be unsatisfactory since the printing colour (picture) will not cover the entire irregularities. It should be appreciated that printing of a conductive layer on a detail for shielding purposes, e.g. a mobile phone casing, is thoroughly discussed in the pending applications PCT/SE97/00372 and SE, 9801502-7, respectively, assigned to LM Ericsson, which applications are incorporated herein by reference. However, these applications are not explicitly related to the printing on irregularities of a detail, e.g. a mobile phone casing.

An object of the present invention is to eliminate this drawback and provide a method and an arrangement, which make it possible to print a determined conductive picture on the more complicated surfaces mentioned above.

Another object of the present invention is to form preferable printing pads which carry said conductive printing colour to the detail to be shielded.

Yet another object of the present invention is to create a conductive printing colour with appropriate tixotropy for applying on the detail to be shielded.

Yet another object of the invention is to overcome the drawbacks with the applying of an electrical circuit pattern on a printing circuit board (PCB) by conventional techniques, e.g. screen printing.

SUMMARY OF THE DISCLOSURE

The above objects are achieved by means of a method, an arrangement, a printing pad, a printing colour and another method as claimed.

The method and the arrangement describes the printing of a conductive picture on the surface of a detail by means of a printing means using a printing method known per se, wherein conductive partial pictures are printed on the surface of the detail so that every part of the conductive picture is built up step by step until the complete picture is achieved, wherein the conductive picture shields the detail from electromagnetic radiation.

By printing partial pictures on the surface of the detail rather than printing the complete picture in one printing, it is easier to cover all irregularities on the surface of the detail.

Another advantage is that the printing means can have a specific design for each particular irregularity to be printed with a partial picture. This increases of course the surface accessibility of the detail.

The printing pad prints a conductive picture containing a conductive colour on an irregular surface of a detail by means of a printing method known per se, wherein the pad fetches the conductive colour from a kliche' and prints the colour on the detail, which colour shields the detail from electromagnetic radiation, and that the printing pad has a shape corresponding to the surface of the detail to be printed.

Since the pad has a shape corresponding to the detail to be printed, e.g. a mobile phone casing, it is easier for the colour to cover all irregularities of the detail. Moreover, the printing of the detail can be carried out in fewer steps.

The metal colour is included in the conductive picture, which is to be printed on the surface of a detail by means of a printing means using a printing method known per se, which colour includes metal particles, an adhesive, a solvent, and an emulsifying agent in order to have an appropriate tixotropy and viscosity for adhering to a printing pad, preferably a silicon tampon pad.

In spite of the heavy weight of the metal colour, it adheres very well to a printing pad, preferably a silicon tampon pad, because of its inventive composition.

The method discloses the printing of an electrical circuit pattern containing metal colour on the surface of detail by means of a printing means using a printing method known per se, wherein the printing means fetches the electrical circuit pattern from a cliché and then print it on the detail.

The conventional techniques for applying circuit patterns on for example printing circuit boards (PCB) are very time consuming and expensive, e.g. screen printing.

The method is a very simple and fast way of applying a circuit pattern on for example a PCB; fetching a circuit pattern from a cliché by means of a tampon pad and then printing the pattern on the PCB or a telephone casing. This method could readily be used in a very fast production line described below for manufacturing of phone casings or PCB:s applied with this electrical circuit pattern. Wider electrical lines, as for example power lines or antenna pattern lines, are particularly suitable for this method. The method could for example be used for printing the antenna pattern on the flip of the phone casing.

A short description of the independent claims and their advantages has now been carried out. Below, a brief discussion of advantageous embodiments of the dependent claims will now be discussed.

A preferable embodiment of the invention is discussed, wherein the printing means prints the conductive partial pictures on the surface of the detail from different application angles for better surface accessibility of the irregularities.

Since the printing means is applied from different angles, the irregularities of the detail will be better covered by the printing colour.

Another preferable embodiment is disclosed, in which a production line method works in the following steps:

moving the detail to a first printing station to print by means of the printing pad a first partial picture on a specific area of the detail from a predetermined angle in relation to this area;

moving the detail to a second printing station to print by means of another printing pad a second partial picture on another specific area of the detail from another angle in relation to this another specific area;

moving the detail to different printing stations in accordance with previous steps building up partial picture by partial picture until the complete picture is finished.

This embodiment describes a profitable production line method for fast manufacturing of printed details, preferably phone casings.

An interesting embodiment is disclosed in which a rotating drive wheel carrying printing pads prints a conductive picture on details transported on a conveyor line, wherein the printing takes place under motion of both the detail on the conveyor band and the drive wheel. It should be realised that the detail and the printing pad in the above embodiments can be replaced by the mobile phone casing and the tampon pad, respectively.

Arrangement claims corresponding to the above embodiments could also be find in the appended set of claims.

Preferable shapes of the tampon pad corresponding to irregular surfaces of a phone casing are discussed in the dependent claims. The tampon pad could for example have an oval, axe, flat or pointed shape or even be cut in sections to be more pliable in the casing.

A preferable design to the cliché is suggested in the dependent claims, wherein the cliché at some areas of the surface have deep recesses to contain more colour. These areas correspond to irregular areas of the mobile phone casing needing more colour. Also a curved cliché is suggested in the dependent claims for facilitating for the tampon pad to absorb the colour.

An advantageous metal colour, which adheres readily on the tampon pad and on the casing is disclosed, in which the metal particles are silver particles, copper particles or silver plated copper particles.

Other characteristics of the invention are set out in other dependent claims.

BRIEF DESCRIPTION OF THE DRAWINGS

The present invention will now be described in more detail with reference to preferred embodiments of the present invention, given only by way of examples, and illustrated in the accompanying drawings in which.

DETAILED DESCRIPTIONS OF EMBODIMENTS OF THE INVENTION

In the following description the printing method and the arrangement of the invention will first be described with reference to FIG. 1–4 and 11–13, respectively. The printing method (i.e. tampon or screen-printing) itself is of course already known in the prior art and the description will not focus on this. After the description of the method and the arrangement to transfer a picture to an irregular surface, certain preferable printing pads (tampon pads) transferring the conductive picture colour to the detail to be shielded will be discussed together with some preferable advantageous printing colours i.e. conductive colours.

Figure 1:
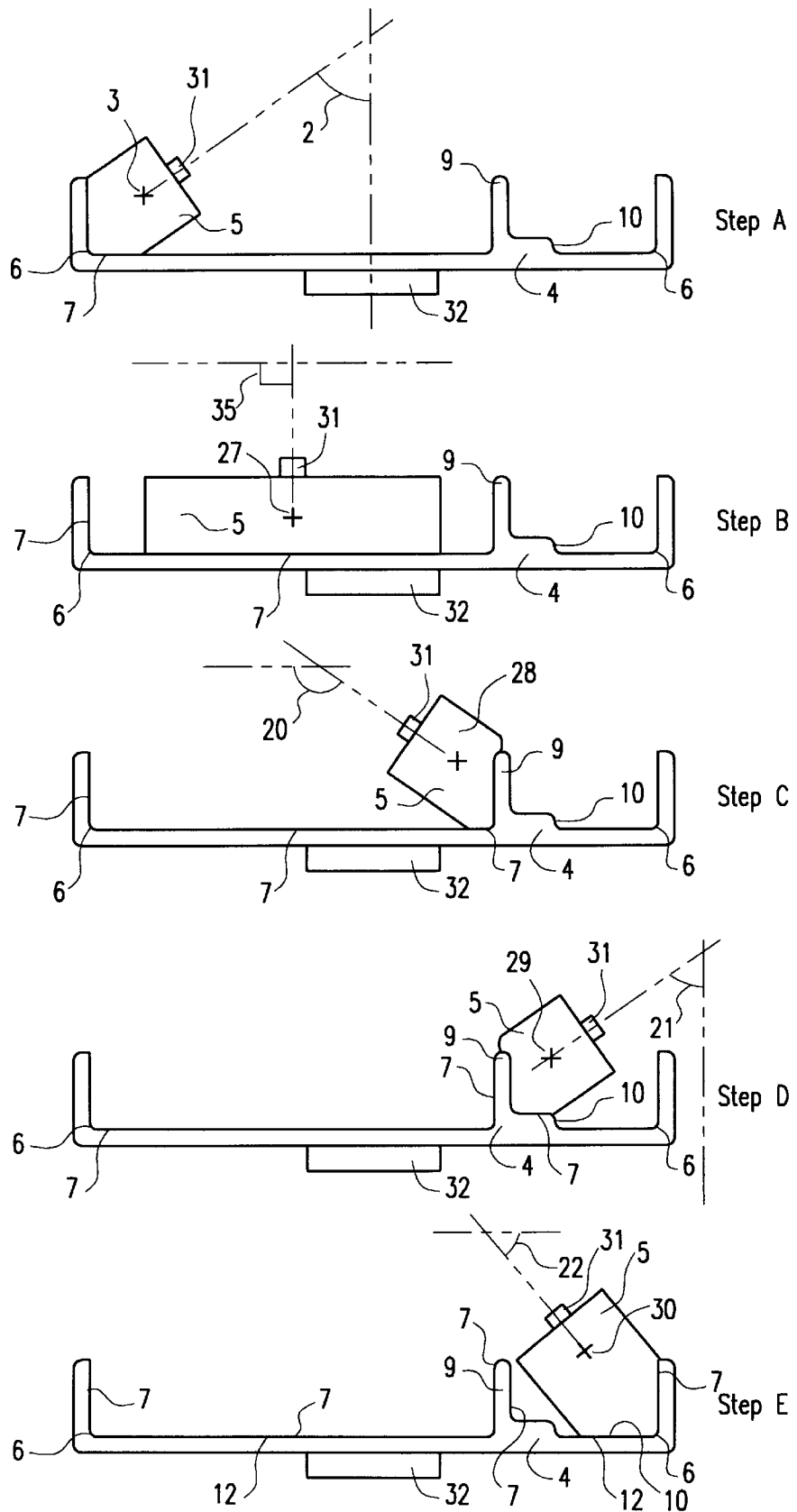
FIG. 1 illustrates the process according to the invention of printing a picture on a complicated surface of a detail.

As is obvious from the embodiment illustrated in FIG. 1, the invention comprises a printing method which transfers at least two partial pictures 7 from a template 19 (cliché), and then print these partial pictures to produce a complete picture 12 on an irregular surface of a detail 4, preferably with corners 6, projections 9, stepped formations 10 or other irregularities, by means of at least one printing pad 5, which is pressed in different steps A–E against the detail from different applications angles 2, 35, 20, 21, 22 and from different positions 3, 27, 28, 29, 30 as can be seen in FIG. 1. In this manner, the surface accessibility i e.g. a corner 6, a projection etc is increased. In this preferred embodiment, either the detail 4 (e.g. a mobile phone casing), the printing pad 5 or both can be turned in three dimensions to provide the different application positions 3, 27, 28, 29, 30 indicated by the steps A–E, which steps also illustrate that the printing pad has different application angles 2, 35, 20, 21, 22 for each step A–E so that a complete picture 12 containing each partial picture is produced on the complicated surface of the detail 4. In the steps A–E of FIG. 1, it is also realised that the printing pad can have different shapes depending on the form or the structure of the surface of the detail 4 in order to get a more satisfactory printing result.

Figure 2:
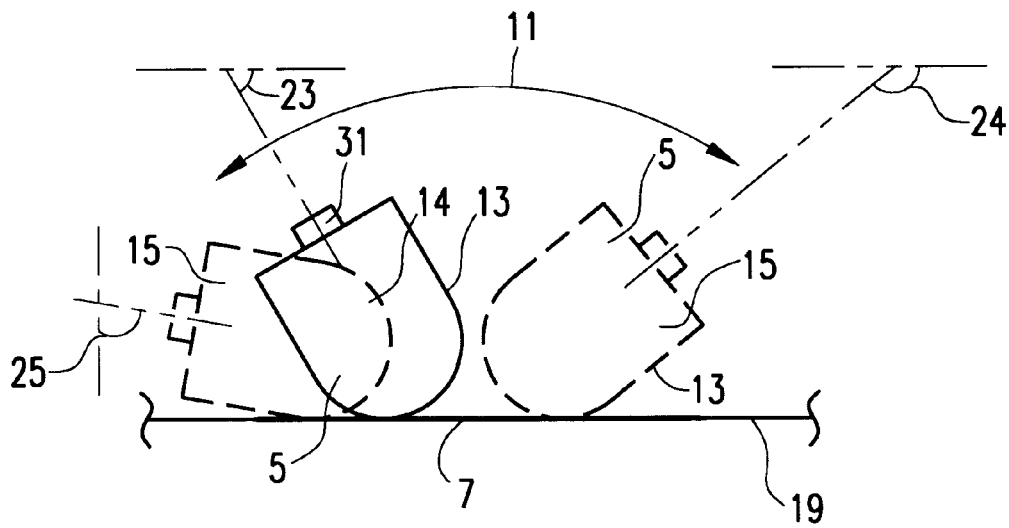
FIG. 2 illustrates how a picture is obtained from a printing plate.
Figure 3:
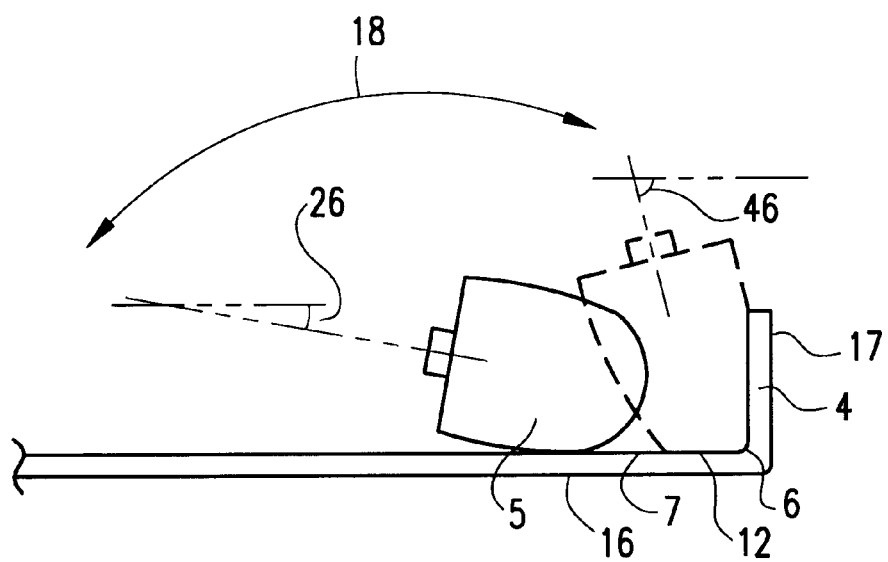
FIG. 3 illustrates how the picture in FIG. 2 is transferred to a detail.

In FIGS. 2 and 3, another embodiment of the invention is illustrated, which is so designed that the printing pad transfers the complete picture 12 or a large partial picture 7 in one or few prints to a complicated surface of the detail. The picture is received from a cliché, template or a printing plate 19 that rests on a normally flat surface by means of the printing pad 5. It should of course be realised that the template could have other different forms, i.e. curved, arched, bulged forms, in order to facilitate the transfer of the printing colour to the entire surface of the printing pad. To be able to get this large partial picture 7 from the template 19 for placing it on a larger surface 13, this can be carried out by letting the printing pad 5 carry out a rolling, rocking or tilting motion 11 back and forth on the template so that the printing pad 5 moves from having a first and second portion each as can be seen in FIG. 2. If the template 19 is more or less curved/bulged when the partial picture 7 is transferred from the template, the rolling movement 11 does not have to be so large, as compared to when the template 19 is flat, since the printing pad 5 receives printing colour on a larger surface area 13 by contacting the curved sides of the template at an earlier stage of the movement 11. For example the template disclosed in FIG. 5–6 could be used for this rolling movement of the printing pad for absorbing the printing colour.

The picture 7 fetched from the cliché is then transferred to the detail 4 by pressing the printing pad under a rolling/tilting movement back and forth against the detail 4. When at least one large partial picture 7 or a complete picture 12 is to be printed, this is achieved by pressing the printing pad against the detail 4 and at the same time let the template roll 18 between angles 26 and 46 over the detail to be printed. This rolling motion 18 of the printing pad is illustrated in FIG. 3. With this movement of the pad 5 a larger surface of the detail is printed compared to the case without the movement 18. Moreover, a complicated partial picture 7 can be printed at the same time on for example the perpendicular sides 16, 17 and in the corner 6 of the detail 4. The movement 11 in FIG. 2 can be provided by letting the template 19 and/or the printing pad 5 move at the same time. The movement 18 in FIG. 3 can also be obtained by letting the printing pad 5 or the detail 4 or both move at the same time.

The printing method described above can carried out by screen-printing, tampon printing or other known printing methods. However, the invention will focus on tampon printing since it empirically has shown to be very effective for printing on irregular surfaces. It should be appreciated that the picture absorbed from the template 19 is a thin layer, which could be made of an inorganic material e.g. a metallic conductive material. The picture could also be made of an organic material e.g. a plastic material or combinations of said materials. The purpose of the colour is to shield the detail 4 from electromagnetic radiation. Below, the composition of a preferred printing colour/picture will discussed in more detail.

With reference to FIG. 1–4, a method is provided in which the detail 4 to be printed is placed in a holding device 32 which is movable so that the position of the detail can be changed, whereby the detail 4 can be subjected to different application angles 2, 35, 20, 21, 22 and positions 3, 27, 28, 29, 30 by the printing pad/tampon pad. Thus, in accordance with the invention the position of the detail can be fixed at the moment of printing so that an easily accessible partial surface of the detail is formed whereby a screen or a tampon printing pad easily can print at least one partial picture thereon.

On the market today, one works with fixed details to be printed. The skilled man is expected to complete the printing with one single point. If the detail has a complicated surface structure, it will not be possible to completely transfer the picture to the detail. If someone in this situation would like to print several times on the detail to complete the printing, the detail has to be released and then fixed again in a new position in order to obtain a new application angle for a printing pad or a screen frame to complete the picture.

Thus, in accordance with the present invention it is possible to carry out partial prints from different directions 2, 35, 20, 21, 22 so that every part of the picture is built up step by step until the complete picture is finished.

To further improve the possibilities of printing on complicated surfaces, several printing machines 31, each equipped with at least one partial picture, can work against the detail 4. These will print the partial picture, one at a time, on the detail in e.g. a production line, wherein the whole picture then will be finished quicker. This could be the case in FIG. 1, in which a fixed printing machine 31 in step A prints a partial picture 7 in the corner 6 of the mobile phone casing 4. In FIG. 1 the casing and the pad are seen in a cross-sectional view. The phone casing fixed in a holding device 32 is then moved to another fixed printing machine in step B, in which another printing pad with a specific shape corresponding to the surface to be printed, prints a nw partial picture 7 on the surface of the phone casing, wherein the phone casing then is moved to the next fixed printing machine in step C and so forth. This method with a production line of fixed printing stations for printing the conductive metal layer on the casing 4 while it is transferred to the different stations is considered to be the best way of carrying out the invention. This method and other preferable methods will now be described in more detail below with reference to the drawings.

Figure 4:
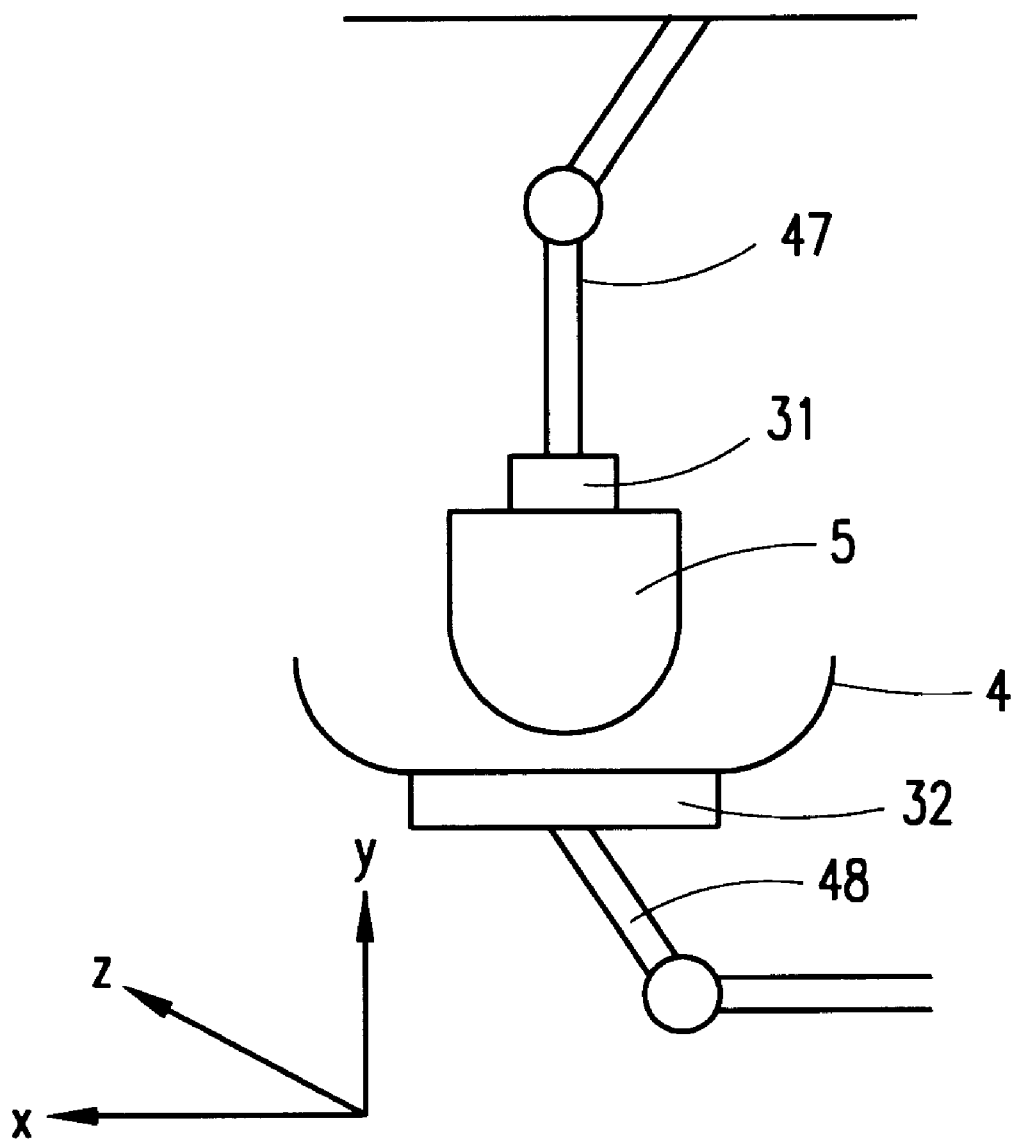
FIG. 4 discloses a diagrammatic view of a printing pad and a detail to be printed, e.g. a mobile phone casing, attached to a holding device.

In another embodiment the mobility of the attached phone casing can be increased, and thereby create even better accessibility for printing on complicated surfaces in that it is different from said first shape which can move in three dimensions x, y, z (FIG. 4). This robot 48 can then interact with at least one printing machine 31, which for example could be controlled by another robot 47. Also, mobility can be obtained by letting the holding device 32 robot 48 be movably connected along a production line, which moves the mobile phone casing to the printing machines in steps A–E in FIG. 1.

It is also possible to envisage that the printing pad and/or the screen frame is movably attached in a corresponding manner as the phone casing is attached to the holding device/robot, preferably to at least one robot which can fetch different printing pads with different partial pictures and then apply them to the phone casing. Of course, one can envisage that both the phone casing and the printing pad or the screen frame are movably attached to the holding devices 31, 32 and robot 47, 48 at the same time.

For further improvement of the ability to print on complicated surfaces, the mobility of the holding device/robot and/or the printing pad can be used not only for each partial printing but also during the moment of printing itself. Then, it will be possible to turn the printing surface in three dimensions x, y, z in compliance with the form of the phone casing during the moment of printing so that irregular surfaces on the phone casing will be better accessible. Then, each partial print can print a larger surface and thereby even manage to print the predetermined surface with perhaps only one single print.

The preferable embodiment briefly discussed above is obtained by means of said production line equipped with a number of pre-set printing machines 31 (steps A–E), which each can print from a predetermined angle 2, 35, 20, 21, 22 and predetermined position 3, 27, 28, 29, 30. The holding device 32 and robot 48 with the mobile phone casing 4 to be printed is then moved between different printing stations in steps A–E and stops at each printing machine 31 (for example step A) where a partial printing is carried out from the application angle 2, wherein the holding device 32 and robot 48 with the mobile phone casing 4 then is moved to the next printing machine (step B) which prints from another angle 35 and from another position 27 on the next partial surface of the casing 4 and then moved on to the remaining printing stations (steps C–D) until all prints of the predetermined picture are completed. A production-line arrangement according to FIG. 1 can be seen in FIG. 12, in which the phone casings to be printed are transferred on a conveying line 37 to different printing stations I, II, III. In Step I corresponding to step B in FIG. 1, the mobile phone casings 4 are printed straight from above by the printing device 31, 5. Approximately 95% of the surface of the casing are printed in this step. Depending on the desired thickness of the coating (picture) on the casing, the printing device can print an arbitrary number of times on the same surface. If for example the thickness of the coating fetched from the cliché is 2 $\mu$m and the desired thickness for good conductivity on the casing is 6 $\mu$m, the printing device has to fetch the colour three times from the cliché and print it on the casing three times. In steps II and III the printing devices 5, 31 print on the casing 4 from the side with different application angles corresponding to steps A, C, D and E in FIG. 1. Another preferable production-line arrangement can be seen in FIG. 13 wherein the printing machine 31 is a drive wheel 31 carrying four tampon pads 5 that prints the shielding picture (coating) on the casing 4 under simultaneous movement of conveyor line 37, drive wheel 5, 31 and the cliché 19. While the lowest tampon pad A prints the coating on the casing 4 the upper one fetches the colour from the rotating cliché the cliché is round in its shape and during rotation it receives colour from a colour container. This arrangement is of course very effective when printing the flat surface of the casing, and the printing speed could be extremely high. However, by turning or tilting the casings while they are in contact with tampon pad A, it should also be possible to print in corners, recesses etc.

Figure 14:
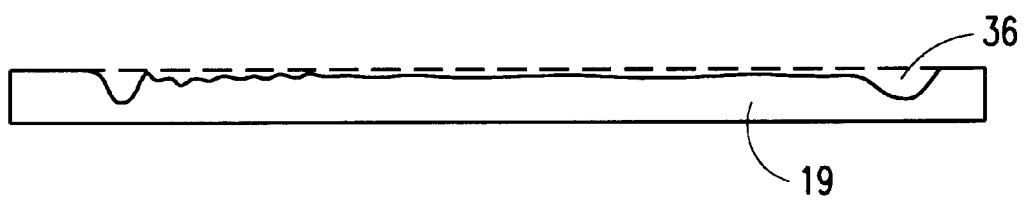
FIG. 14 discloses a cross section side view of a printing plate (cliché) according to the invention.

In the methods described above, the picture to be printed on the detail is fetched from a printing plate, cliché (template) surface 19 that can be flat or formed as a bulging surface. This fetching technique is known per se in the prior art. In FIG. 14 an inventive cliché is seen from a cross-sectional side view. The pattern on the cliché 19 is achieved by means of photo etching, and some parts of this pattern have deep recesses 36 to be able to contain more colour. The positions of these deep recesses 36 in the cliché depend on the appearance of the casing surface to be printed. Thus, a deep recess 36 should correspond to a strong irregularity of the casing surface so that the tampon pad 5 easily could fetch and print this larger amount of colour on this irregularity in order to cover it better. It should be realised that in the description the more general term printing plate relates to a cliché 19 or a template 19. The printing pad, the screen frame and the printing plate can be bulged and have differently shaped surfaces in order to better enable printing on a casing 4 with complicated surfaces, which will be described below with reference to FIG. 5–10. during the actural moment of printing when the predetermined picture is to be transferred to the casing 4, this can take place under movement of either the casing 4 and/or the printing pad/screen frame as described above. To further improve the accessibility for the printing pad/screen frame, also a movement of the printing pad/casing to be printed takes place so that the application angle is also changed during the actual moment of printing. The rolling movement 11, 18 of the printing pad in FIG. 2, 3 could be performed by means of a robot 32.

An important component in the present invention is of course the printing colour containing metal or other conductive elements, which colour is to be printed on the casing 4 for shielding purposes. It should be realised that the term colour in this invention is equivalent with the term coating. However, the term colour is more appropriate since the invention relates to a printing method.

A preferable metal colour includes metal particles (especially silver particles), an adhesive, a solvent and an emulsifying agent in order to obtain a colour with appropriate tixotropy and viscosity, and which is conductive and adheres to the printing pad. However, colour containing silver particles is very expensive (approx. 200 $/kg). To achieve cheaper colour, copper or silver plaited copper particles are used in the colour as the conductive material. The colour is quite heavy and the weight is about four times higher than ordinary decoration colour. In spite of the weight, the metal colour with the composition described above adheres very well to a tampon pad, particularly to a silicon tampon pad. With the inventive tampon pad printing method it is easy to apply a metal colour layer with a predetermined thickness all over the casing 4 to increase the conductivity and thereby the shielding effect. An arbitrary predetermined thickness of the metal layer on the casing can be achieved by letting the tampon pad fetch a metal layer with a specific thickness an arbitrary predetermined number of times from the template and then print it on the casing the same number of times. Normally the thickness of the layer should be larger than 3 $\mu$m, preferably 15–50 $\mu$m, to have good conductive properties. As mentioned above the tampon printing method, in contrary to the spraying and vacuum vaporisation method, applies the metal layer on the casing with an overall equal and even thickness; this property lies inherent in general printing technique, which makes it most convenient for using in shielding of electrical components. The thickness of the entire layer applied to the casing 4 is the same as the thickness of the layer received from the template 19. The layer applied with the spraying or the vaporisation technique is uneven and certain areas have thickenings implying an additional cost since the colour is very expensive.

Figure 5:
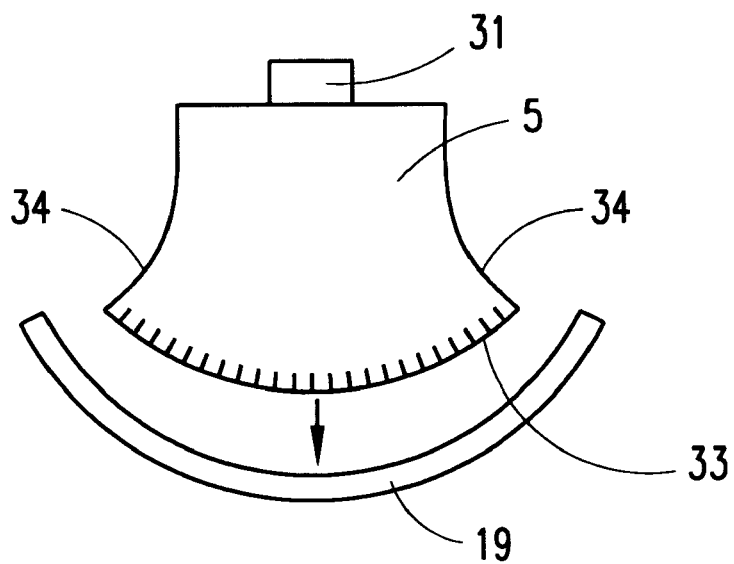
FIG. 5–6 disclose different printing pads interacting with printing plates for absorbing the printing colour.
Figure 6:
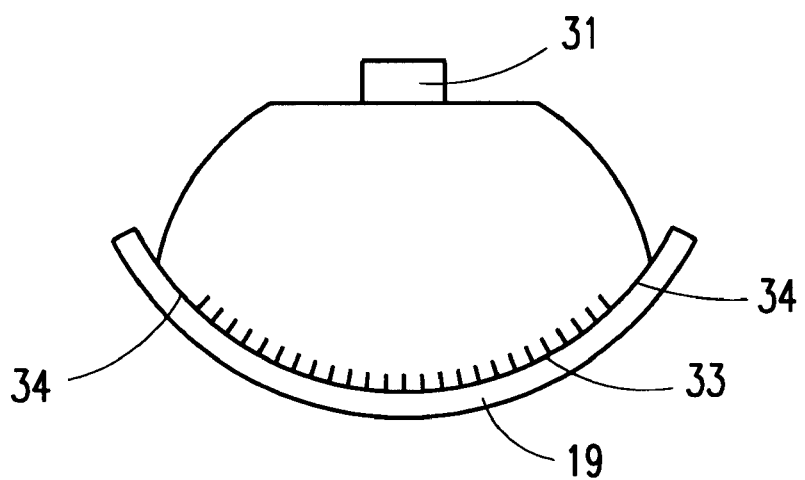
Figure 7:
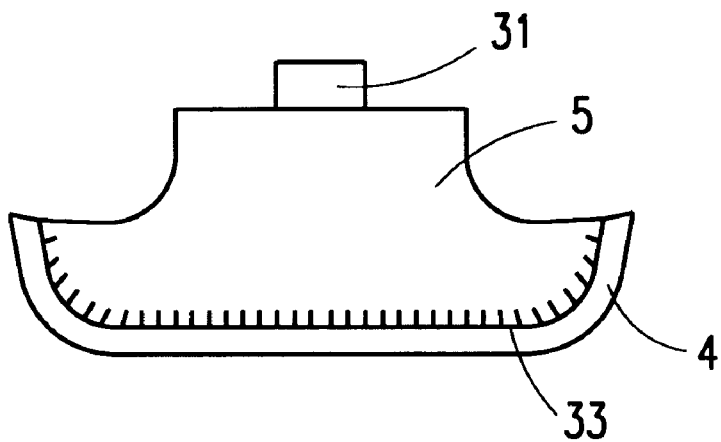
FIG. 7 shows a cross-section of the printing pad in FIG. 5–6 in printing mode of a mobile phone casing.
Figure 8:
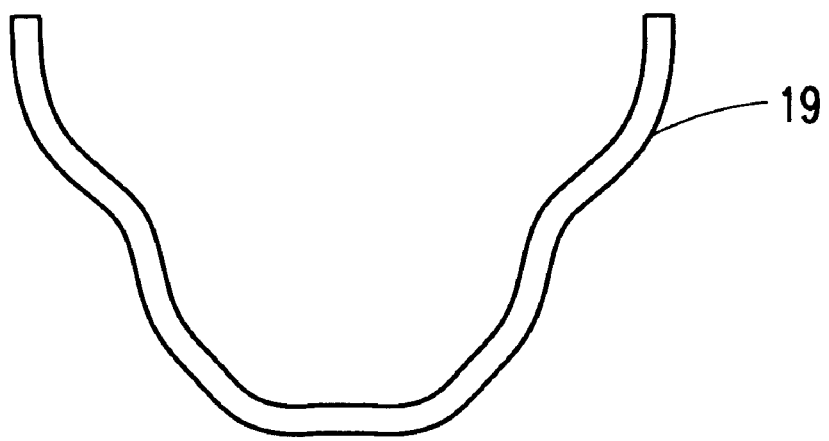
FIG. 8 is a printing plate (template) in a sectional view according to the invention.
Figure 9:
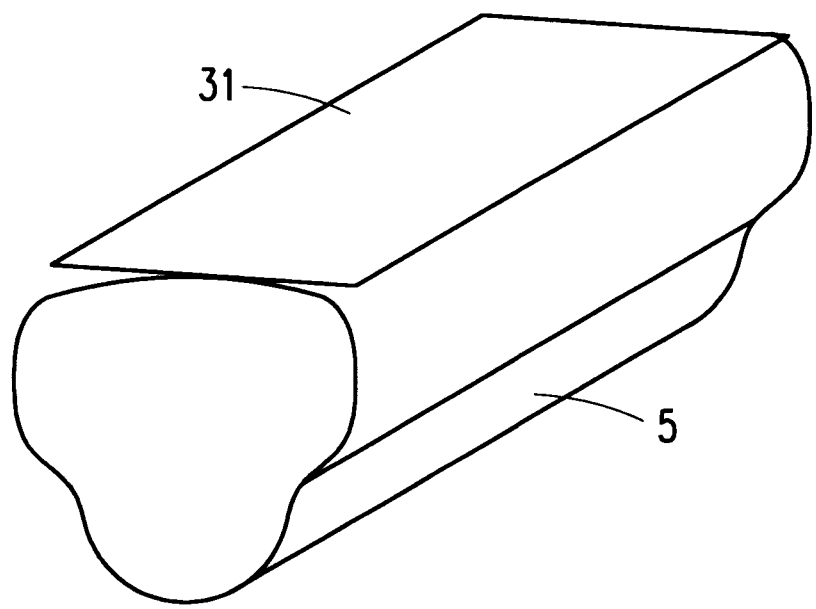
FIG. 9 is another printing pad in perspective view with a form corresponding to the printing plate in FIG. 8.
Figure 10:
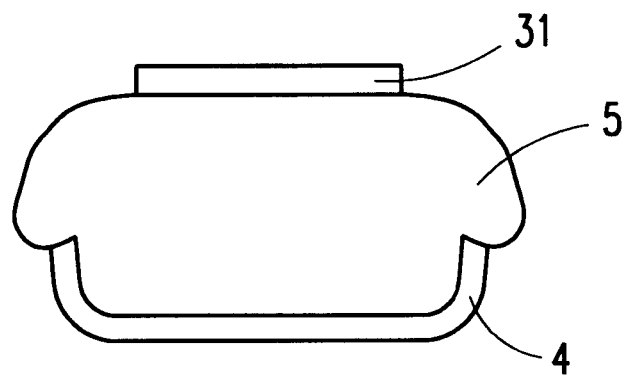
FIG. 10 discloses a cross-section view of the printing pad in FIG. 9 being pressed against the interior of a mobile phone casing for printing a conductive colour thereon.
Figure 11:
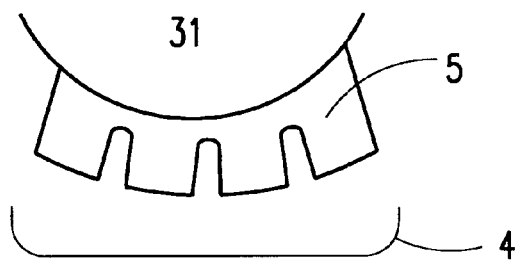
FIG. 11 is a cross-sectional side view of a mobile phone casing and a preferable tampon pad.
Figure 12:
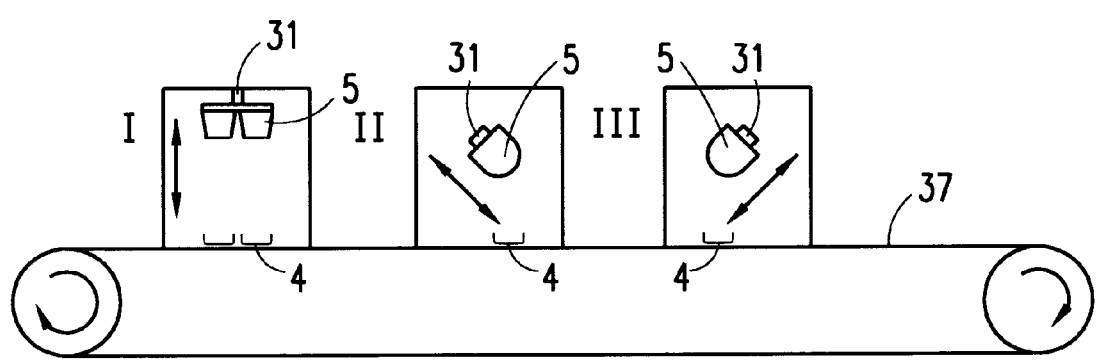
FIG. 12 is a preferable production line arrangement of the invention according to FIG. 1.
Figure 13:
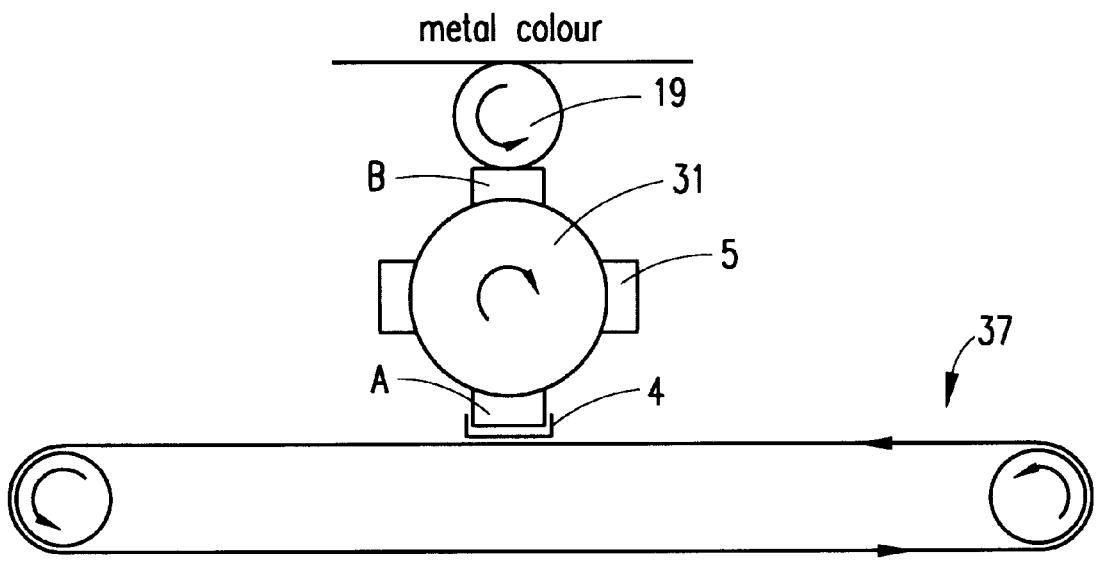
FIG. 13 is another production line arrangement of the invention.

The following description will now be directed to FIG. 5–11 describing different shapes of the printing plates and the tampon pads, respectively. Instead of the oval shaped and rectangular shaped tampon pads disclosed in FIG. 1 the tampon pad 5 could be axe shaped as can be seen in FIG. 5 and 6 with this axe form of the tampon pad it is possible to print the entire metal layer with one print as can be seen in FIG. 7. When the tampon pad in FIG. 7 is pressed against the casing 4 even the sides of the casing is covered and printed by the pad. In FIG. 6 the axe shaped tampon pad is pressed against the curved template 19 for absorbing the colour. Since the template is curved with a form corresponding to that of the tampon pad the colour will adhere to the tampon pad easier and faster. As can be seen in FIG. 6 even the sides 34 of the tampon pad can receive the colour. FIG. 8 and 9 disclose other forms of the template and the tampon pad, respectively. The form of the template in FIG. 8 corresponds to the form of the tampon pad in FIG. 9, wherein the tampon pad easily can absorb the colour from the template. In FIG. 10 the tampon pad 5 in FIG. 9 is pressed against a mobile phone casing 4, the side-edges of which are covered and printed in a very efficient manner. Other forms of the tampon pads are of course possible. The pad could for example have one or many projections at the bottom 33 in order to better cover irregularities of the casing 4. The pad 5 could have cavities at the bottom 33 or elsewhere in order to be more soft and pliable. The pad (soft) could for example be injected with air at the printing moment (FIG. 7, 10), wherein the pad would increase in size and even penetrate the smallest recesses in the casing 4 etc. In FIG. 11 another preferable shape of a tampon pad 5 is disclosed, which pad is cut in different sections in order to be more pliable in relation to the casing 4 for printing more effectively on the sides and on the irregularities of the casing. The different forms of the pads and the printing plates in the figures could of course readily be implemented in the production line according to FIG. 1, 2, 12 and 13.

In order to implement the invention, combinations and variations of the methods described above can of course be achieved to improve the accessibility upon printing.

Figure 15:
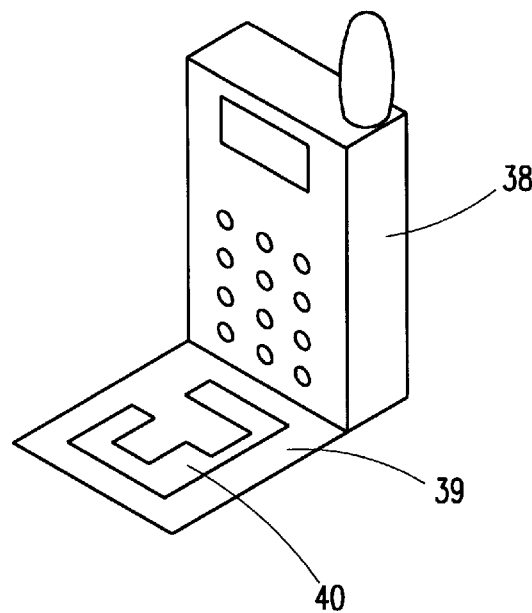
FIG. 15 discloses a mobile phone with an open flip.

It should be realised that the above method and arrangement also could be used for printing an electrical circuit pattern on the detail (4). In this case we are only interested in the conductivity of the circuit pattern and not the shielding effect. The electrical circuit pattern is etched on the cliché, fetched by the printing pad (tampon pad) and then printed on the detail e.g. a PCB, a mobile phone casing 4. It should also be realised that with this method a first conductive circuit pattern could be printed on the detail. Then another insulating colour (layer) could be printed above the first conductive pattern not covering the complete conductive pattern. After that a second conductive pattern could be printed on the insulating colour, which second conductive pattern contacts the first conductive pattern at those places not covered by the insulating colour. In this way several different layers (insulating and conductive) could be built up forming a complex circuit structure. The discussed method is particularly advantageous for printing power lines and antenna pattern on the casing or the flip of the mobile phone casing since the power lines or antenna pattern lines are wider than ordinary circuit lines. In FIG. 15 a mobile phone 38 with a flip 39 is disclosed. The antenna pattern 40 on the flip is printed by means of the above discussed tampon pad.

Figure 16:
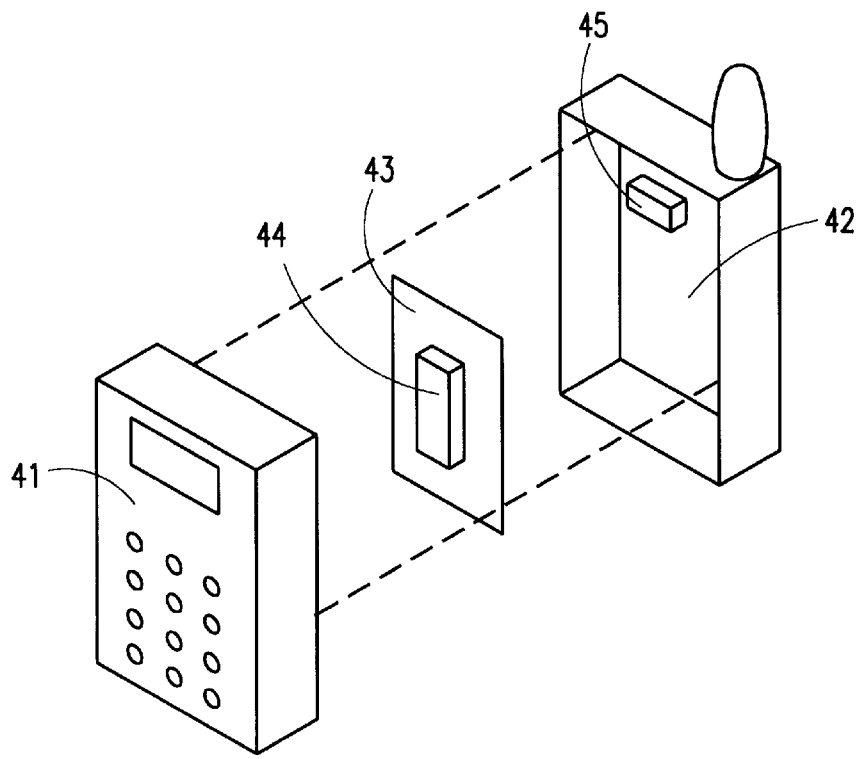
FIG. 16 is an exploded view of a front casing, back casing and a component to be shielded in a mobile telephone.

In FIG. 16 an exploded view of a front casing 41 of a mobile phone, a back casing 42 of a mobile phone and an electrical component 44 is disclosed. The interior of the front and back casings 41, 42 are applied with the above discussed conductive printing colour by means of the above discussed methods in order to shield the environment from electromagnetic radiation created by the component 44, which component 44 is mounted inside the mobile telephone. The panel 43 arranged between the two electrical components 44, 45 inside the telephone could also be coated with the conductive printing colour in order to shield the component 45, e.g. the radio transceiver from the other component 44, e.g. a clock circuit.

It would be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. A method for printing a complete conductive picture on a given one of a plurality of surfaces of a detail, said given surface having a first and second portion each having irregularities, said method comprising the steps of:

printing a first conductive partial picture on said first portion of said given surface of the detail using a first one of at least one printing pad, said first printing pad having a first shape corresponding to said irregularities of said first portion of said given surface of said detail where said first conductive partial picture is printed;

printing at least a second conductive partial picture on said second portion of said given surface of said detail using a second one of said at least one printing pad to achieve said complete conductive picture, said second printing pad having a second shape different from said first shape corresponding to said irregularities of said given surface of said second portion of said detail where said second conductive partial picture is printed; and shielding said detail from electromagnetic radiation using said complete conductive picture.

2. The method of claim 1, wherein said at least one printed pad prints said conductive partial pictures on said given surface of said detail from different application angles for better surface accessibility of said irregularities.

3. The method of claim 1, wherein said at least one printing pad prints said conductive partial pictures on said given surface of said detail from different positions for better surface accessibility of said irregularities.

4. The method of claim 1, further comprising the step of:

moving said at least one printing pad or said detail during said steps of printing to better access said irregularities on said given surface of said detail.

5. The method of claim 1, wherein said step of printing said first conductive partial picture further comprises the step of:

moving said detail to a first printing station to print by means of said printing pad said first partial picture on said given surface of said detail from a predetermined angle in relation to said given surface, said step of printing said second conductive partial picture further comprising the step of:

moving said detail to a second printing station to print by means of another said printing pad said second partial picture on said given surface of said detail from another angle in relation to said given surface.

6. The method of claim 5, wherein said printing stations are provided along a production line.

7. The method of claim 1, wherein said steps of printing are performed by using a rotating drive wheel carrying said at least one printing pad and a conveyor line for transporting said detail, said steps of printing being performed under motion of both said detail on said conveyor line and said drive wheel.

8. The method of claim 1, wherein said detail is a mobile phone casing.

9. The method of claim 1, wherein said complete conductive picture is a metal printing colour.

10. The method of claim 1, wherein said at least one printing pad is a tampon pad.

11. A method for printing a complete conductive picture on a given one of a plurality of surfaces of a detail, said method comprising the steps of:

fetching, by at least one printing pad, first and second partial pictures from a printing plate by carrying out a rolling motion on said printing plate in order to absorb said respective conductive partial pictures on the sides and on the flat surface of said at least one printing pad to obtain larger respective conductive partial pictures from said printing plate;

printing said first conductive partial picture on said given surface of the detail using said at least one printing pad;

printing at least said second conductive partial picture on said given surface of said detail using said at least one printing pad to achieve said complete conductive picture; and shielding said detail from electromagnetic radiation using said complete conductive picture.

12. The method of claim 11, wherein said steps of printing further comprises the step of:

carrying out another rolling motion on said given surface of said detail, by said printing pad, in order to obtain a larger surface area on said given surface of said detail for each of said respective conductive partial pictures.

13. The method of claim 11, wherein said complete conductive picture is a metal printing coating.

14. The method of claim 13, wherein an arbitrary predetermined thickness of said metal printing coating on said detail is achieved by letting said printing pad fetch a partial metal printing coating with a specific thickness an arbitrary number of times from said printing plate and perform said steps of printing the same number of times as said arbitrary number of times.

15. The method of claim 11, wherein said printing plate comprises one of the following: a cliche or template.

16. A method for printing a complex structure on a given one of a plurality of surfaces of a detail comprising the steps of:

fetching an electrical circuit pattern containing metal color from a cliche using a printing device;

printing said electrical circuit pattern on said given surface of said detail, using said printing device, said metal color shielding said electrical circuit pattern from electromagnetic radiation;

printing an insulating pattern above said electrical circuit pattern on said given surface, using said printing device, said insulating pattern not completely covering said electrical circuit pattern; and printing another electrical circuit pattern above said insulating pattern of said given surface, using said printing device, wherein both said electrical circuit patterns contact each other at those places not covered by said insulating pattern, said steps of printing said insulating pattern and printing another said electrical circuit pattern being alternated to obtain said complex structure having an arbitrary number of electrical circuit pattern layers and insulating layers, respectively.

17. The method of claim 16, wherein said detail is a PCB.

18. The method of claim 17, wherein said electrical circuit pattern comprises one of the following: power lines or antenna lines.

19. The method of claim 16, wherein said detail is a mobile telephone casing and said printing device is a tampon pad, said electrical circuit pattern being printed on said casing.

* * * * *